United States Patent
Tsuji et al.

[19]

[11] Patent Number: 5,917,766
[45] Date of Patent: Jun. 29, 1999

[54] SEMICONDUCTOR MEMORY DEVICE THAT CAN CARRY OUT READ DISTURB TESTING AND BURN-IN TESTING RELIABLY

[75] Inventors: Takaharu Tsuji; Mikio Asakura; Tadaaki Yamauchi; Koji Tanaka, all of Hyogo, Japan

[73] Assignee: Mitsubishi Denki Kabushiki Kaisha, Tokyo, Japan

[21] Appl. No.: 08/978,594

[22] Filed: Nov. 26, 1997

Related U.S. Application Data

[63] Continuation of application No. 08/749,159, Nov. 14, 1996, abandoned.

[30] Foreign Application Priority Data

May 28, 1996 [JP] Japan ................................. 8-133604

[51] Int. Cl.$^6$ .................................................. G11C 7/00
[52] U.S. Cl. ........................................ 365/201; 365/189.11
[58] Field of Search .............................. 365/201, 189.11, 365/193

[56] References Cited

U.S. PATENT DOCUMENTS

| | | | |
|---|---|---|---|
| 4,999,813 | 3/1991 | Ohtsuka et al. | 365/189.11 |
| 5,388,077 | 2/1995 | Sanada | 365/201 |
| 5,424,990 | 6/1995 | Ohsawa | 365/201 |
| 5,504,715 | 4/1996 | Lee et al. | 365/189.11 |
| 5,568,436 | 10/1996 | Furuyama | 365/201 |

FOREIGN PATENT DOCUMENTS

| | | |
|---|---|---|
| 2-177100 | 7/1990 | Japan . |
| 6-176598 | 6/1994 | Japan . |
| 7-234265 | 9/1995 | Japan . |

*Primary Examiner*—Son T. Dinh
*Attorney, Agent, or Firm*—McDermott, Will & Emery

[57] ABSTRACT

A semiconductor memory device that operates in various modes such as in a normal operation mode and a disturb accelerated test mode in which two word lines are activated simultaneously, includes a boosting power supply circuit, a boosted voltage supply line, and an input terminal connected to the boosted voltage supply line. In a disturb accelerated test mode or in a burn-in test mode, an external voltage is supplied from an external power supply to the input terminal. A word line is reliably boosted in voltage in a disturb accelerated test mode.

17 Claims, 15 Drawing Sheets

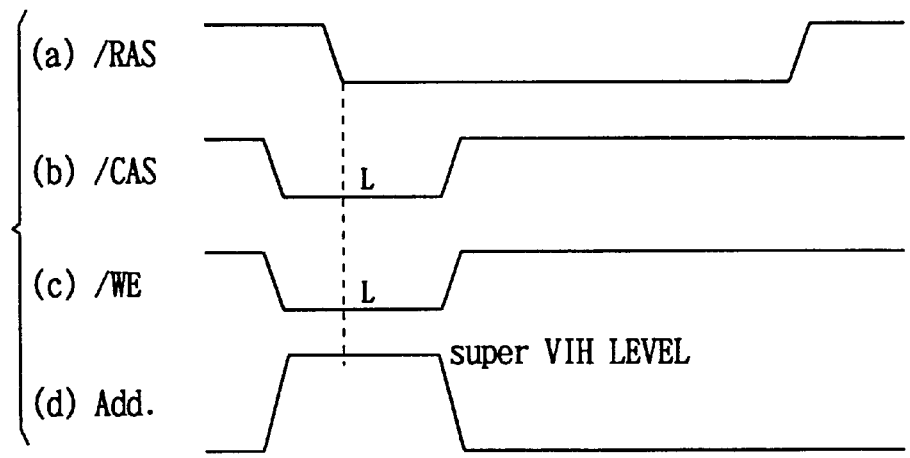
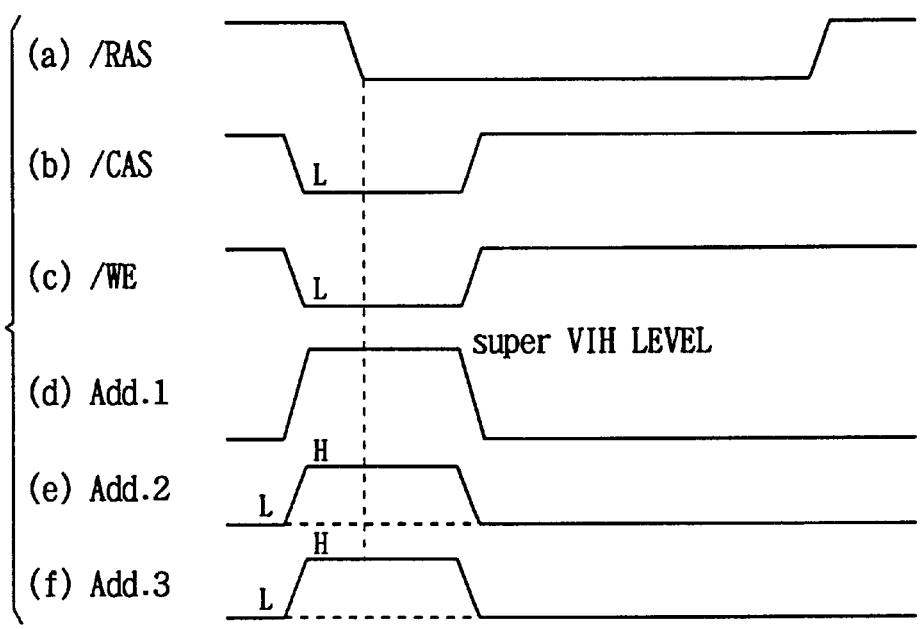

SEMICONDUCTOR MEMORY DEVICE THAT CAN CARRY OUT READ DISTURB TESTING AND BURN-IN TESTING RELIABLY

This application is a continuation of Application Ser. No. 08/749,159 filed Nov. 14, 1996, now abandoned.

BACKGROUND OF THE INVENTION

1. Field of the Invention

The present invention relates to semiconductor memory devices, and more particularly, to a semiconductor memory device that can operate in a normal operation mode, a read disturb test mode, and a burn-in test mode.

2. Description of the Background Art

FIG. 17 shows the entire structure of a semiconductor memory device including a dynamic random access memory (DRAM) with a read disturb test mode for detecting refresh error.

In read disturb testing, a read out operation is repeated for a constant time period with respect to one word line. A situation is created to facilitate data leakage from a memory cell connected to that word line. Data leakage is accelerated to detect refresh error. This read disturb testing is time consuming since it is generally carried out for all the word lines sequentially from word line WL1 to word line WLn (normal disturb testing).

A possible consideration for reducing the time required for testing is to select two or more row addresses at the same time such as word line WL1 and word line WL (n/2+1) and carry out a readout operation simultaneously (disturb accelerated test mode).

FIG. 18 shows a structure of a conventional semiconductor memory device that can operate in a normal operation mode and a burn-in test mode.

In general, a dynamic random access memory (DRAM) is subjected to an accelerated test mode (burn-in testing) wherein electrical stress is applied at a temperature higher than that of normal usage to eliminate any device that has the potential of initial defect prior to shipment of the product.

As shown in FIG. 18, a voltage that is down-converted with respect to an external power supply voltage is applied to internal circuitry such as memory cell array 3 in a normal operation mode in a DRAM including a voltage-down power supply unit 30. Since sufficient electrical stress cannot be applied to the internal circuitry such as memory cell array 3 in burn-in testing, the external power supply voltage is applied to the internal circuitry without reduction in burn-in testing.

However, power consumption due to the boosted potential consumed by the word line becomes greater than two times that of a conventional normal disturb test because a plurality of word lines are driven in response to two or more row addresses being selected simultaneously. There is a possibility that a word line is not boosted to a sufficient level in a read disturb test due to constrain in the power supply capability of a boosting power supply circuit 1 and another boosting power supply circuit 2 additionally provided for the test mode. In this case, the semiconductor memory device will operate erroneously, or will cause degradation in data retaining characteristics, if operated, to make it difficult to correlate with a normal disturb test.

In the conventional semiconductor memory device operating in a normal operation mode and a burn-in test mode shown in FIG. 18, a boosted voltage generated from a boosting power supply circuit 1 is applied to a word line driving circuit 7 and output circuit 6 as shown in FIG. 18. In a shared sense amplifier system in which a sense amplifier 4 disposed at the middle of a bit line is shared with two pairs of bit lines at either side thereof, a boosted voltage is applied from boosting power supply circuit 1 to select a bit line pair that is to be activated.

The level of the boosted voltage generated from boosting power supply circuit 1 varies according to difference in the process and temperature. It is difficult to control the boosted voltage during burn-in testing. There is a problem that sufficient stress cannot be applied to entire circuitry such as word line driving circuit 7 and output circuit 6 during a burn-in test mode to ensure acceleration.

SUMMARY OF THE INVENTION

An object of the present invention is to provide a semiconductor memory device that can operate in a disturb accelerated test mode reliably in a shorter time.

Another object of the present invention is to provide a semiconductor memory device that can operate in a burn-in test mode reliably.

According to an aspect of the present invention, a semiconductor memory device with a normal operation mode and a read disturb test mode includes a word line, a word line driving circuit, a boosted voltage generation circuit for generating a boosted voltage, a boosted voltage supply line, and an input terminal. The word line driving circuit responds to a row address signal for driving a word line in a normal operation mode, and for activating at least two word lines simultaneously in a read disturb test mode. The boosted voltage supply line connects the boosted voltage generation circuit and the word line driving circuit to supply a boosted voltage to the word line driving circuit. The input terminal is connected to the boosted voltage supply line for receiving an externally applied external voltage in a read disturb test mode.

According to another aspect of the present invention, a semiconductor memory device includes a memory cell array, a voltage-down circuit, and an external power supply voltage feed circuit. The voltage-down circuit down-converts an external power supply voltage to generate an internal power supply voltage which is supplied to the memory cell array in a normal operation mode, and supplies the external power supply voltage to the memory cell array in a read disturb test mode. The external power supply voltage feed circuit applies the external power supply voltage to the memory cell array only during a read disturb test mode.

According to a further aspect of the present invention, a semiconductor memory device that operates in a normal operation mode and a burn-in test mode includes a boosting power supply circuit for generating a boosted voltage, an internal circuit to which a boosted voltage is supplied, a boosted voltage supply line for connecting the boosting power supply circuit with the internal circuit, an input terminal connected to the boosted voltage supply line, and receiving an externally applied first external voltage in a burn-in test mode, a voltage-down circuit for down-converting an external power supply voltage to generate and supply to the internal circuit an internal power supply voltage in a normal operation mode, and for supplying the external power supply voltage to the internal circuit in a burn-in test mode, and an external power supply voltage feed circuit for supplying to the internal circuit the external power supply voltage in a burn-in test mode.

A main advantage of the present invention is that a read disturb test can be realized reliably and speedily without having to additionally provide a power supply circuit for read disturb testing.

Another advantage of the present invention is that a read disturb test can be carried out more reliably and speedily using an existing voltage-down circuit.

A further advantage of the present invention is that a burn-in test can be carried out reliably since stress can be applied irrespective of variation in the process and temperature.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 13a–13d are a timing diagram for describing an operation of the semiconductor memory device of FIG. 10.

FIGS. 16a–16f are timing charts for describing an operation of a semiconductor memory device shown in FIG. 14.

DESCRIPTION OF THE PREFERRED EMBODIMENTS

Figure 1:
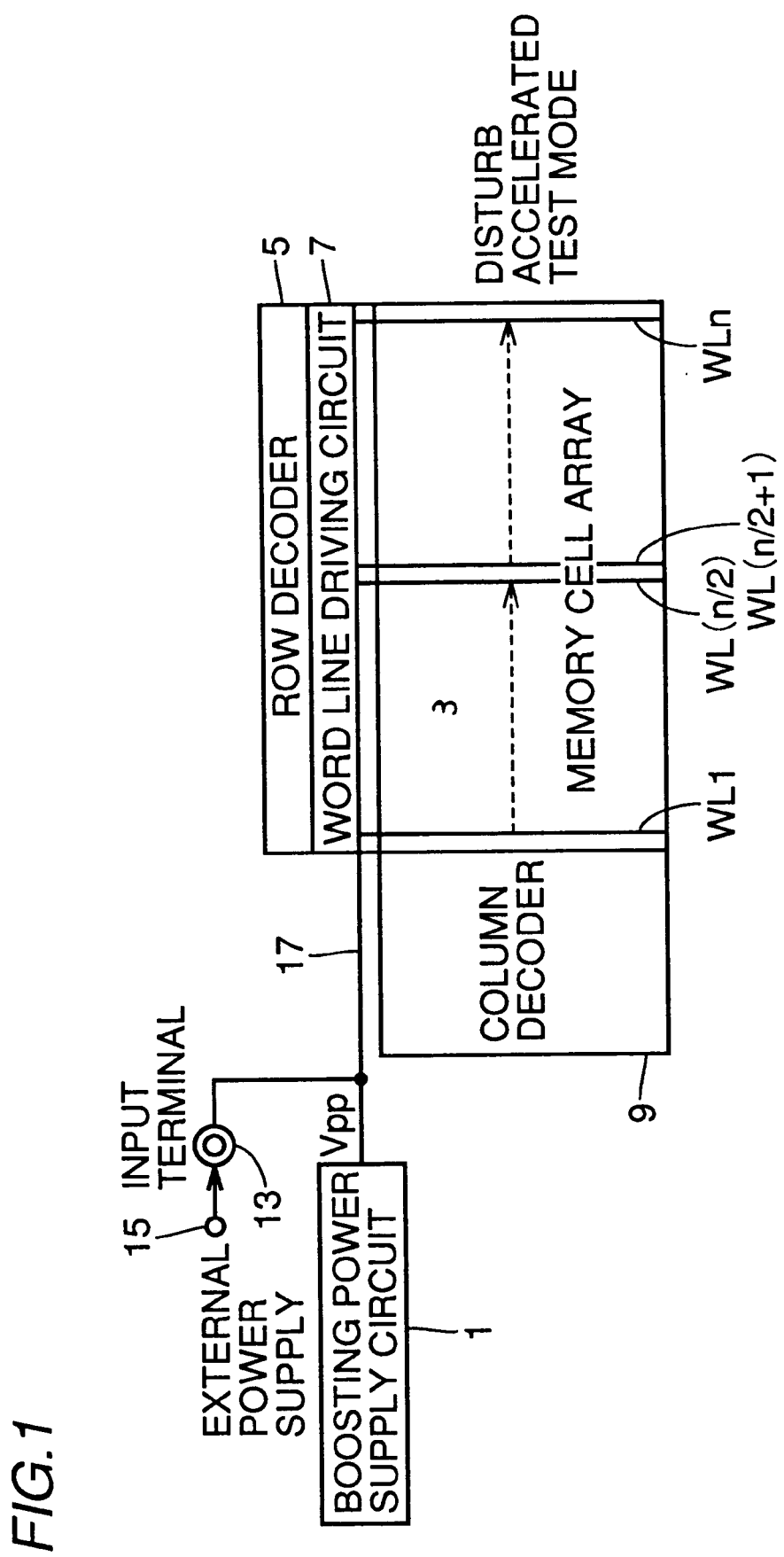
FIG. 1 shows an entire structure of a semiconductor memory device according to a first embodiment of the present invention.

Embodiments of the present invention will be described hereinafter with reference to the drawings. In the drawings, like reference characters designate the same or corresponding components.

It is assumed that the semiconductor memory device in all the embodiments operate in a normal operation mode, in a disturb accelerated test mode in which two word lines are activated simultaneously, a burn-in test mode, or in all these three modes.

First Embodiment

Referring to FIG. 1, a semiconductor memory device of the first embodiment includes a memory cell array 3 for storing data, a row decoder 5, a column decoder 9, word lines WL1–WLn, a word line driving circuit 7 responsive to a row address signals supplied from row decoder 5 for driving a word line, a boosting power supply circuit 1 for generating a boosted voltage Vpp according to an external power supply voltage, a boosted voltage supply line 17 for connecting boosting power supply circuit 1 and word line driving circuit 7 to supply the boosted voltage to word line driving circuit 7, and an input terminal 13 connected to boosted voltage supply line 17.

Figure 2:
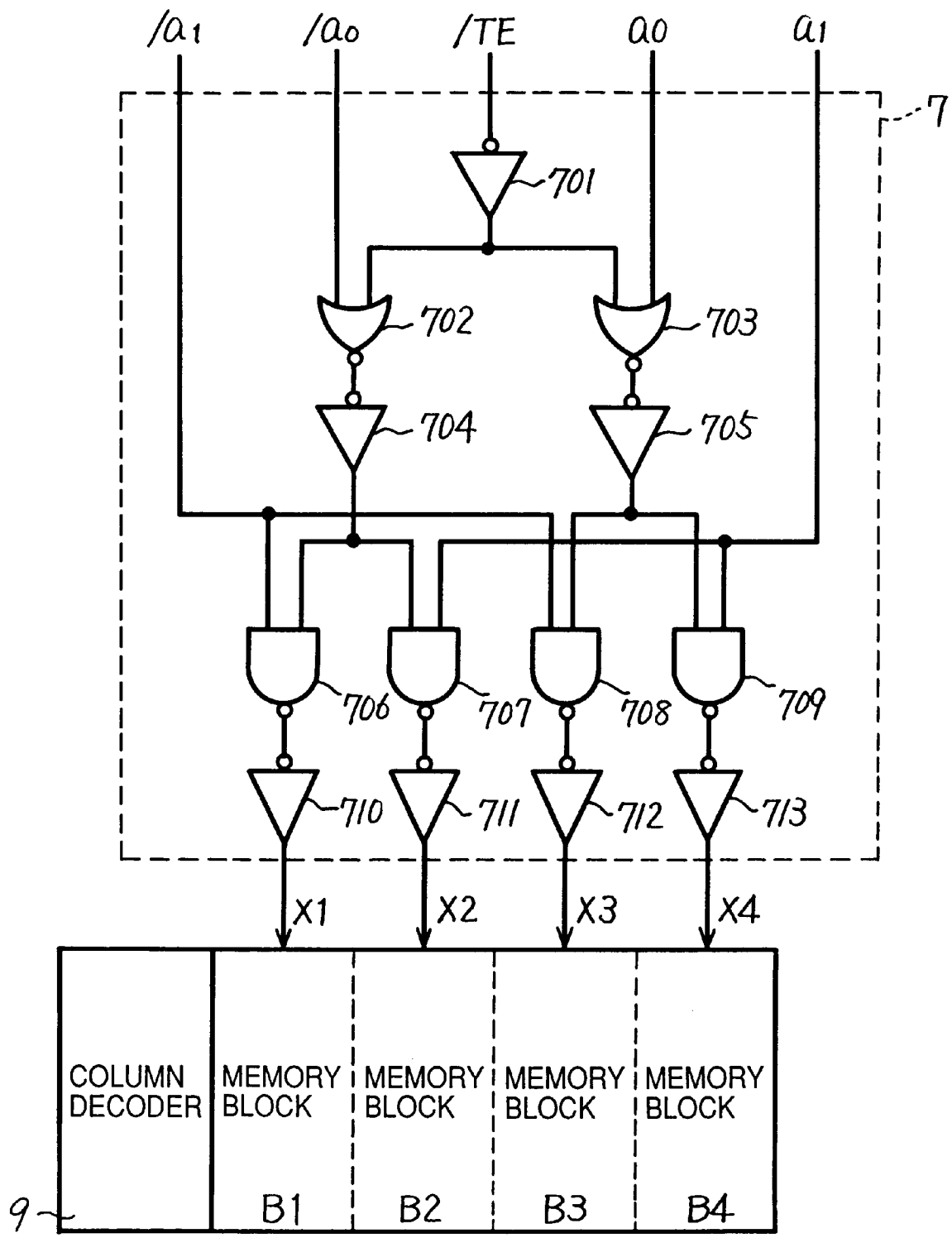
FIG. 2 shows a specific configuration of the word line driving circuit of FIG. 1.

Word line driving circuit 7, column decoder 9, and memory cell array 3 are shown in FIG. 2. In FIG. 2, memory cell array 3 is divided into 4 memory blocks, i.e. B1, B2, B3, and B4.

Referring to FIG. 2, word line driving circuit 7 includes NOR circuits 702 and 703, inverters 701, 704, 705, 710, 711, 712 and 713, and NAND circuits 706, 707, 708 and 709.

The operation of the semiconductor memory device will be described hereinafter.

In a normal operation mode, a test mode enable signal /TE of an inactive high level (referred to as "H level" hereinafter) is applied to inverter 701 of word line driving circuit 7 shown in FIG. 2. A low level is referred to as "L level" hereinafter. When address signals ($a_0$, /$a_0$, $a_1$, /$a_1$) of (L, H, L, H) levels are input, decode signals (X1, X2, X3, X4) of (H, L, L, L) levels are output from inverters 710, 711, 712 and 713 of FIG. 2, whereby a word line in memory block B1 is selected.

In a disturb accelerated test mode, test mode enable signal /TE of an activated L level is applied to inverter 701 of word line driving circuit 7 shown in FIG. 2.

When address signals ($a_0$, /$a_0$, $a_1$, /$a_1$) of (L, H, L, H) levels are input, decode signals (X1, X2, X3, X4) of (H, L, H, L) levels are output from inverters 710, 711, 712, and 713, respectively, whereby word lines in memory block B1 and memory block B3 are activated at the same time.

In this disturb accelerated test mode, an external voltage from external power supply 15 is applied to input terminal 13 of FIG. 1 to supply the external voltage to boosted voltage supply line 17.

By supplying an external voltage to the semiconductor memory device from an output source, a word line can be reliably boosted in voltage in a disturb accelerated test mode without having to additionally provide a boosting power supply circuit in the semiconductor memory device.

Second Embodiment

Figure 3:
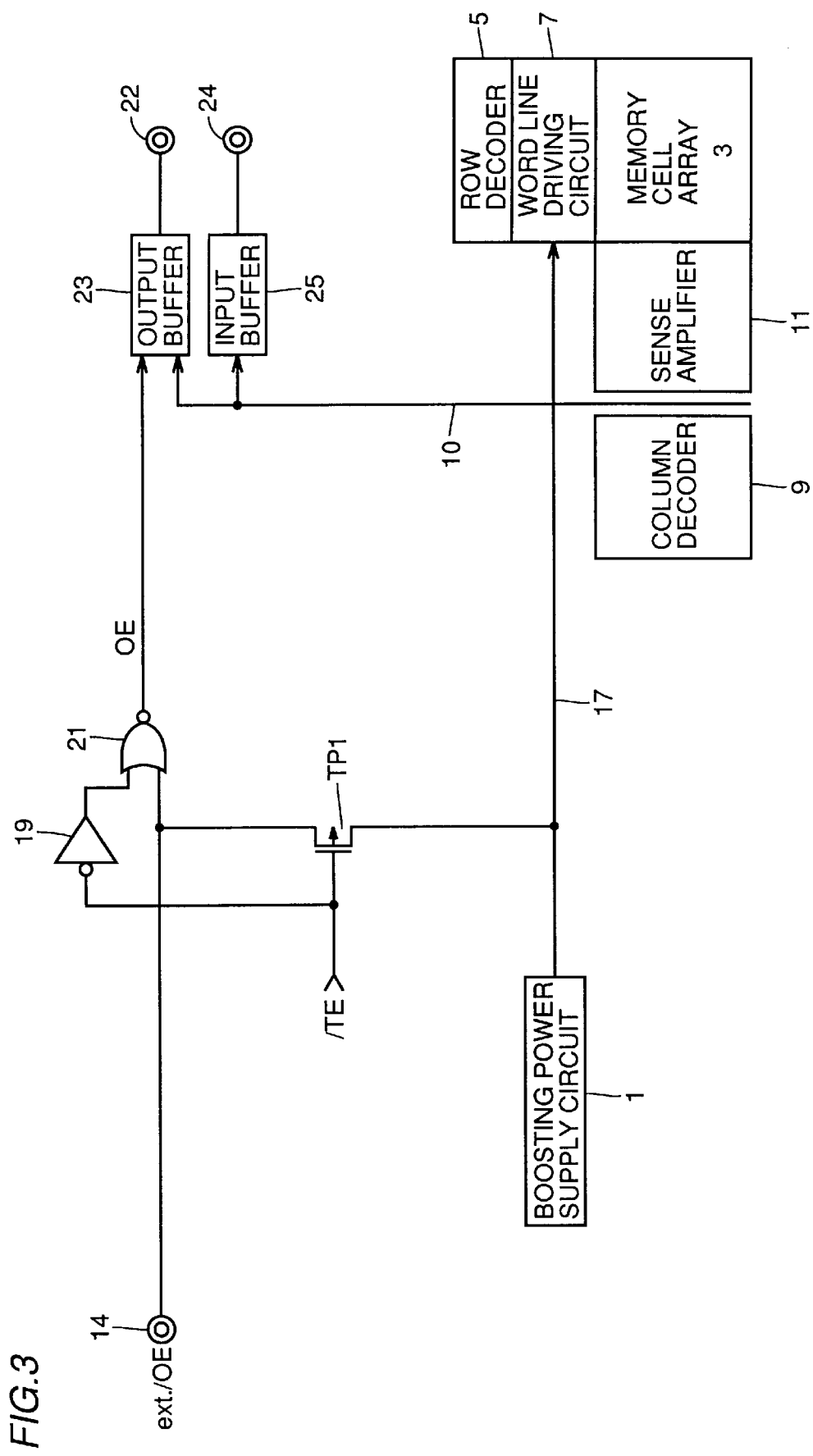
FIGS. 3 and 4 shows an entire structure of a semiconductor memory device according to second and third embodiments, respectively, of the present invention.

Similar to the first embodiment, a semiconductor memory device of the second embodiment of the present invention shown in FIG. 3 includes a boosting power supply circuit 1, a memory cell array 3, a row decoder 5, a word line driving circuit 7, a column decoder 9, a boosted voltage supply line 17, a sense amplifier 11, an I/O line 10, an output buffer 23 and an input buffer 25 connected to I/O line 10, a data output terminal 22 connected to output buffer 23, a data input terminal 24 connected to input buffer 25, an output enable terminal 14, a P channel MOS transistor TP1 connected between output enable terminal 14 and boosted voltage supply line 17, an inverter 19, and an NOR circuit 21.

In a disturb accelerate test mode, an external output enable signal ext./OE is not applied to output enable terminal 14.

The operation of the semiconductor memory device of the second embodiment will be described hereinafter.

In a disturb accelerated test mode, test mode enable signal /TE of an activated L level is applied to the gate of P channel MOS transistor TP1. As a result, P channel MOS transistor TP1 is turned on.

Here, external voltage is supplied to output enable terminal 14. Also, test mode enable signal /TE of an L level is applied to inverter 19 to have its logic level inverted to an H level. Test mode enable signal /TE of an H level is applied to NOR circuit 21. In response, an OE signal fixed to an L level is output from NOR circuit 21, so that output buffer 23 is inactivated in a disturb accelerated test mode. Therefore, data stored in memory cell array 3 will not be output from data output terminal 22 via output buffer 23 in a disturb accelerated test mode.

In a normal operation mode, test mode enable signal /TE of an inactivated H level is applied to the gate of P channel MOS transistor TP1. As a result, P channel MOS transistor TP1 is turned off. Also, test enable signal /TE of an H level is applied to inverter 19 to have its logic level inverted to an L level. This test mode enable signal /TE of an L level is applied to NOR circuit 21. In response to output enable signal ext./OE applied to output enable terminal 14, an OE signal is provided from NOR circuit 21 to output buffer 23. In other words, an OE signal of an activated H level is provided from NOR circuit 21 when external output enable signal ext./OE of an activated L level is applied to output enable terminal 14, whereas an OE signal of an inactive L level is provided from NOR circuit 21 to output buffer 23 when external output enable signal ext./OE of an inactive H level is applied to output enable terminal 14.

Here, output buffer 23 responds to an activated OE signal to provide the data stored in memory cell array 3 to data output terminal 22 via I/O line 10.

The semiconductor memory device of the present embodiment takes advantage of an unused terminal, when molded, during a disturb accelerate test mode.

Third Embodiment

Figure 4:
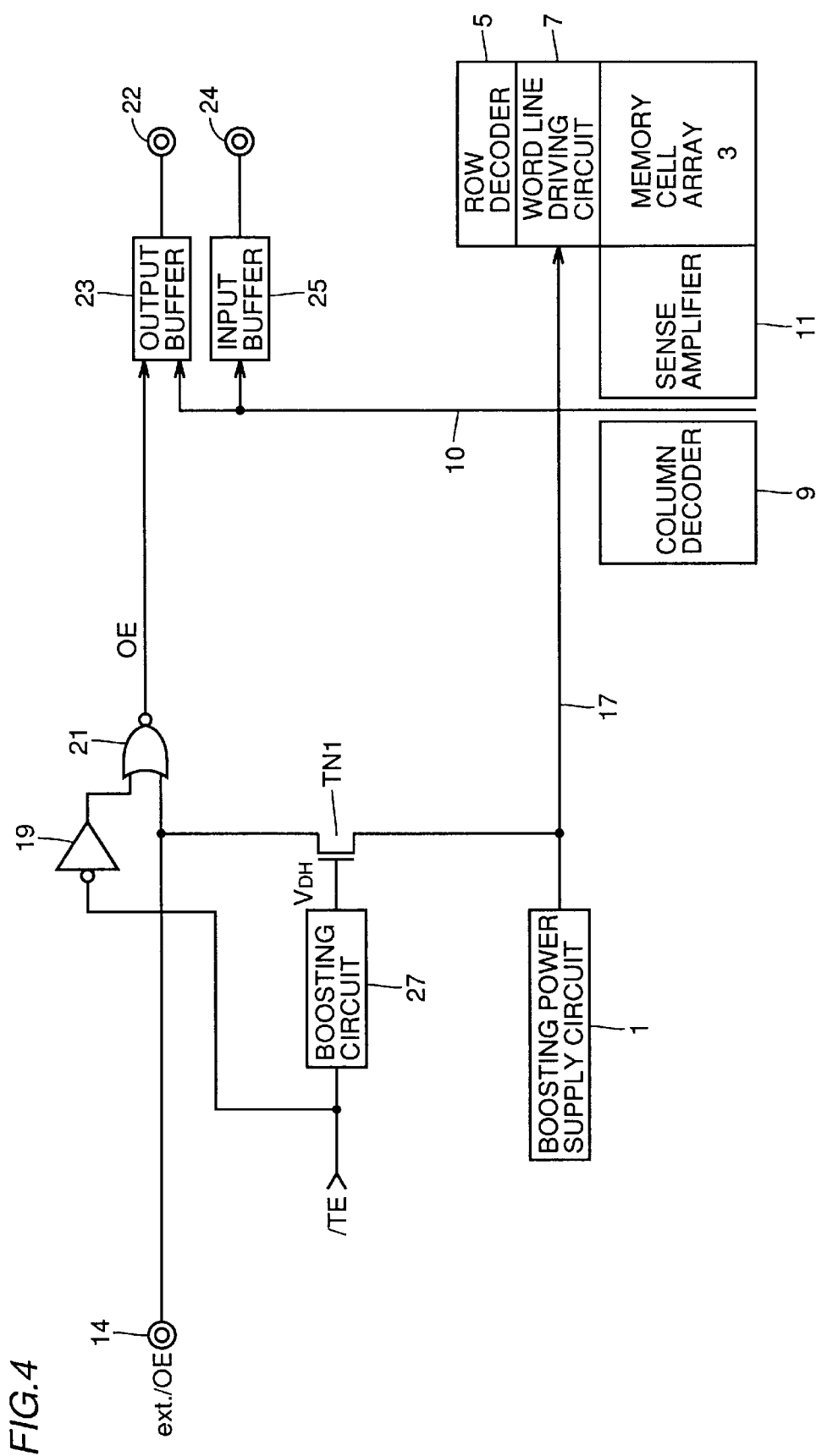

Referring to FIG. 4, a semiconductor memory device of the third embodiment has a structure similar to that of the second embodiment, provided at an N channel MOS transistor TN1 is connected between output enable terminal 14 and boosted voltage supply line 17, and a boosting circuit 27 is connected to the gate of N channel MOS transistor TN1.

Figure 5:
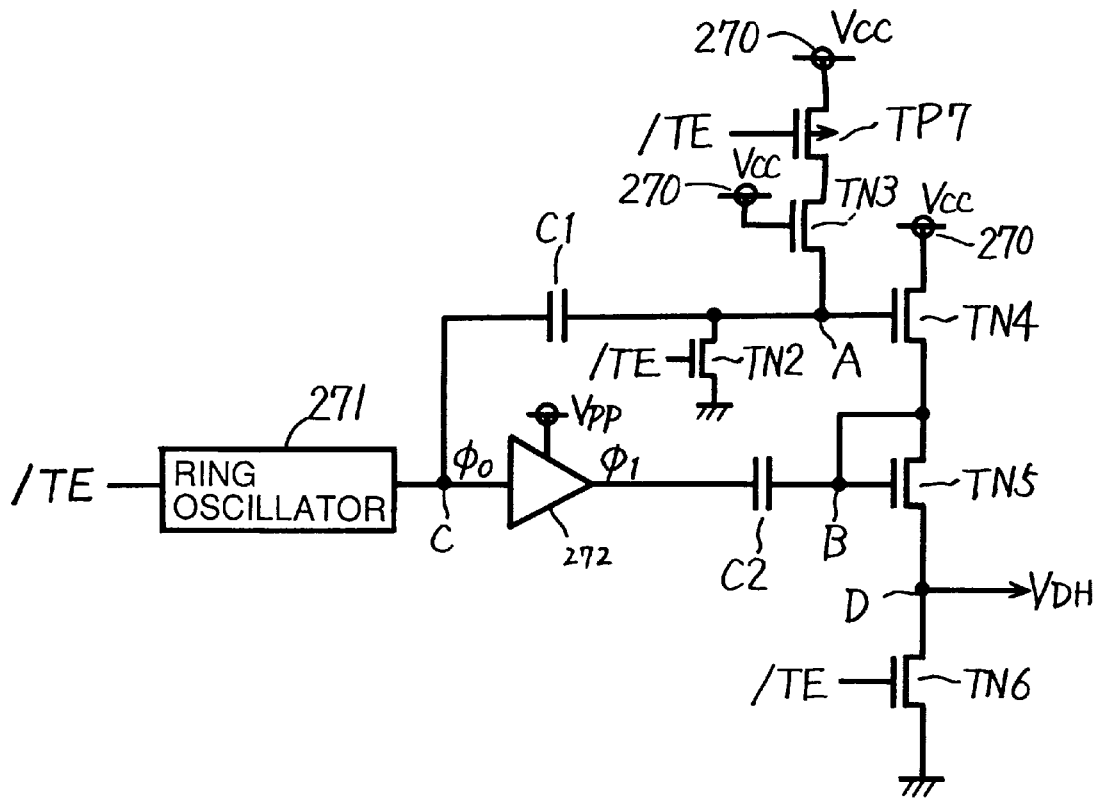
FIG. 5 shows a specific structure of the boosting circuit of FIG. 4.

Referring to FIG. 5, boosting circuit 27 includes a ring oscillator 271, a level shifter 272, capacitors C1 and C2, N channel MOS transistors TN2, TN3, TN4, TN5 and TN6, a P channel MOS transistor TP7, a power supply node 270, and nodes A, B, C and D.

Figure 6:
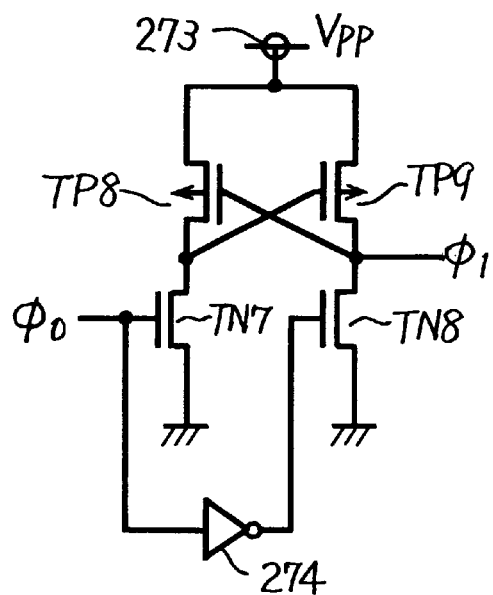
FIG. 6 is a circuit diagram showing a specific structure of the level shifter of FIG. 5.

Referring to FIG. 6, level shifter 272 includes a boosting power supply node 273, P channel MOS transistors TP8 and TP9, N channel MOS transistors TN7 and TN8, and an inverter 274. Level shifter 272 provides a signal $\phi_i$ of a ground voltage level when a signal $\phi_0$ of a ground voltage level is applied, and provides a signal $\phi_1$ of a boosted voltage Vpp level from boosted power supply node 273 when a signal $\phi_0$ of a power supply voltage Vcc level is input.

Figure 7:
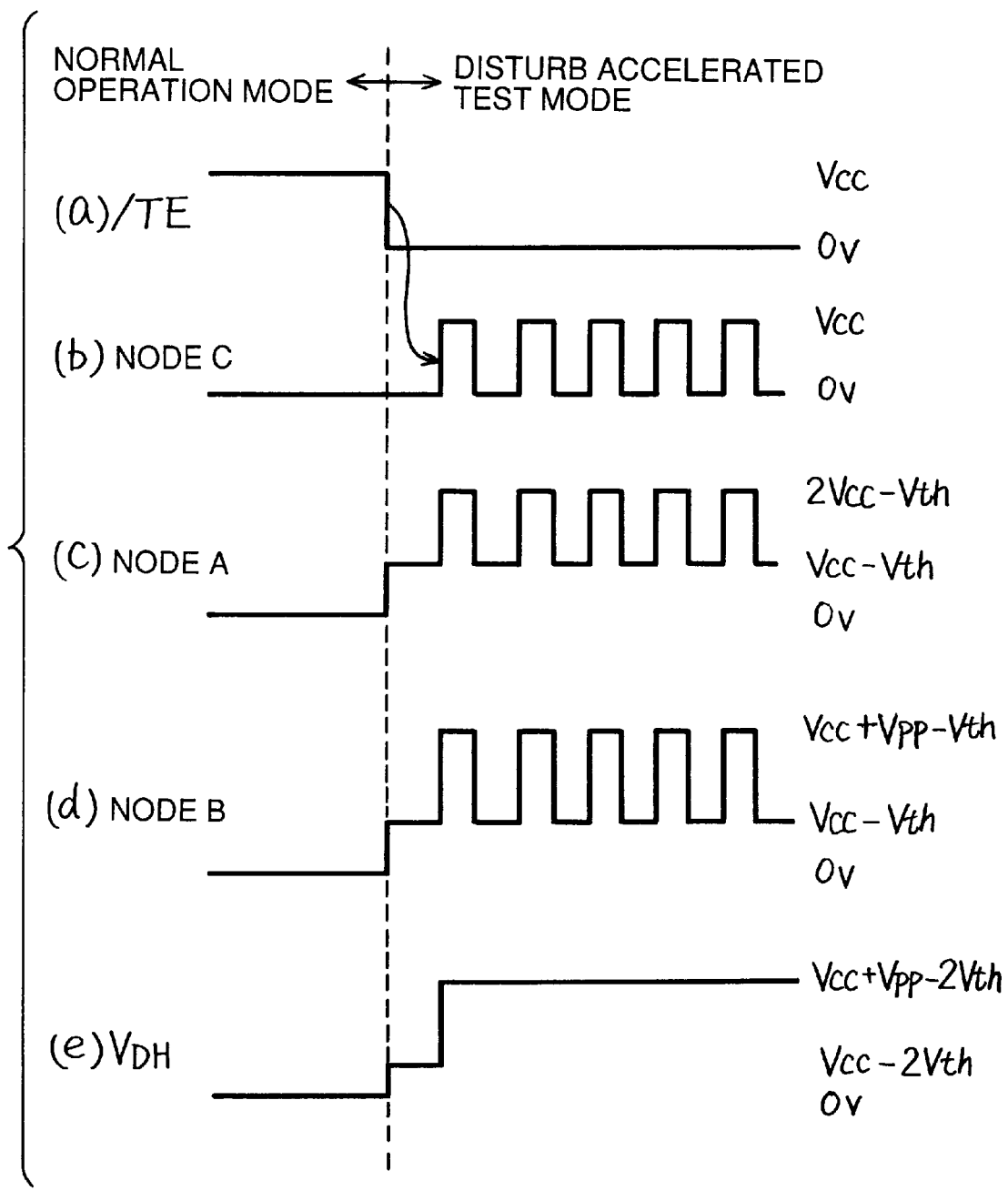
FIGS. 7a–7e are timing charts for describing an operation of the boosting circuit of FIG. 5.

The operation of boosting circuit 27 shown in FIG. 5 will be described with reference to the timing chart of FIG. 7.

As shown in FIG. 7(a), test mode enable signal /TE attains a Vcc level (H level), so that N channel MOS transistors TN2 and TN6 are ON in a normal operation mode. Therefore, the potential of node A is 0 V as shown in FIG. 7(c), and a voltage $V_{DH}$ of 0 V is output from node D as shown FIG. 7(e). Therefore, N channel MOS transistor TN1 of FIG. 4 is turned off in a normal operation mode.

In a disturb accelerated test mode, test mode enable signal /TE is activated at 0 V (L level) as shown in FIG. 7(a), so that N channel MOS transistors TN2 and TN6 are turned off and P channel MOS transistor TP7 is turned on. Therefore, the potential of node A is (Vcc−Vth), where Vth is the threshold voltage of the N channel MOS transistor, as shown in (c). In response to N channel MOS transistor TN4 being turned on, the potential of node B becomes (Vcc−Vth), as shown in (d). Furthermore, N channel MOS transistor TN5 is turned on, so that voltage $V_{DH}$ of the potential level of (Vcc−2Vth) is output from node D.

Here, ring oscillator 271 is activated in response to input of test mode enable signal /TE of an L level to generate a clock signal having an amplitude of 0 V to power supply voltage Vcc at a constant period. As a result, the potential of node C exhibits an amplitude between 0 V and Vcc at a constant period as shown in (b). The potential of node A is affected by the above-described clock signal by coupling of capacitor C1 to exhibit an amplitude between (Vcc−Vth) and (2Vcc−Vth) at a constant period as shown in (c). The clock signal output from ring oscillator 271 is set to have an amplitude between 0 V and Vpp at level shifter 272. The potential of node B is affected by this clock signal according to coupling of capacitor C2 to exhibit an amplitude between (Vcc−Vth) and (Vcc+Vpp−2Vth) as shown in (d). The increase of the potential of node B to the level of (Vcc+Vpp−Vth) causes voltage $V_{DH}$ having a potential level of (Vcc+Vpp−2Vth) to be output from node D, as shown in (e), via N channel MOS transistor TN5.

Since N channel MOS transistor TN6 is always turned off in a disturb accelerated test mode, voltage $V_{DN}$ output from node D is maintained at the level of (Vcc+Vpp−2Vth) during the disturb accelerated test mode. Therefore, N channel MOS transistor TN1 of FIG. 4 continuously attains an ON state.

Thus, the semiconductor memory device of the third embodiment can have external voltage supplied to boosted voltage supply line 17 from output enable signal 14 via N channel MOS transistor TN1 in a disturb accelerated test mode. It is to be noted that the external voltage supplied to boosted voltage supply line 17 is lowered by threshold voltage Vth of N channel MOS transistor TN1. The provision of boosting circuit 27 for boosting the gate of N channel MOS transistor TN1 allows an external voltage of a potential higher than the power supply potential to be supplied to boosted voltage supply line 17 by operating boosting circuit 27 during a disturb accelerate test mode.

Fourth Embodiment

Figure 8:
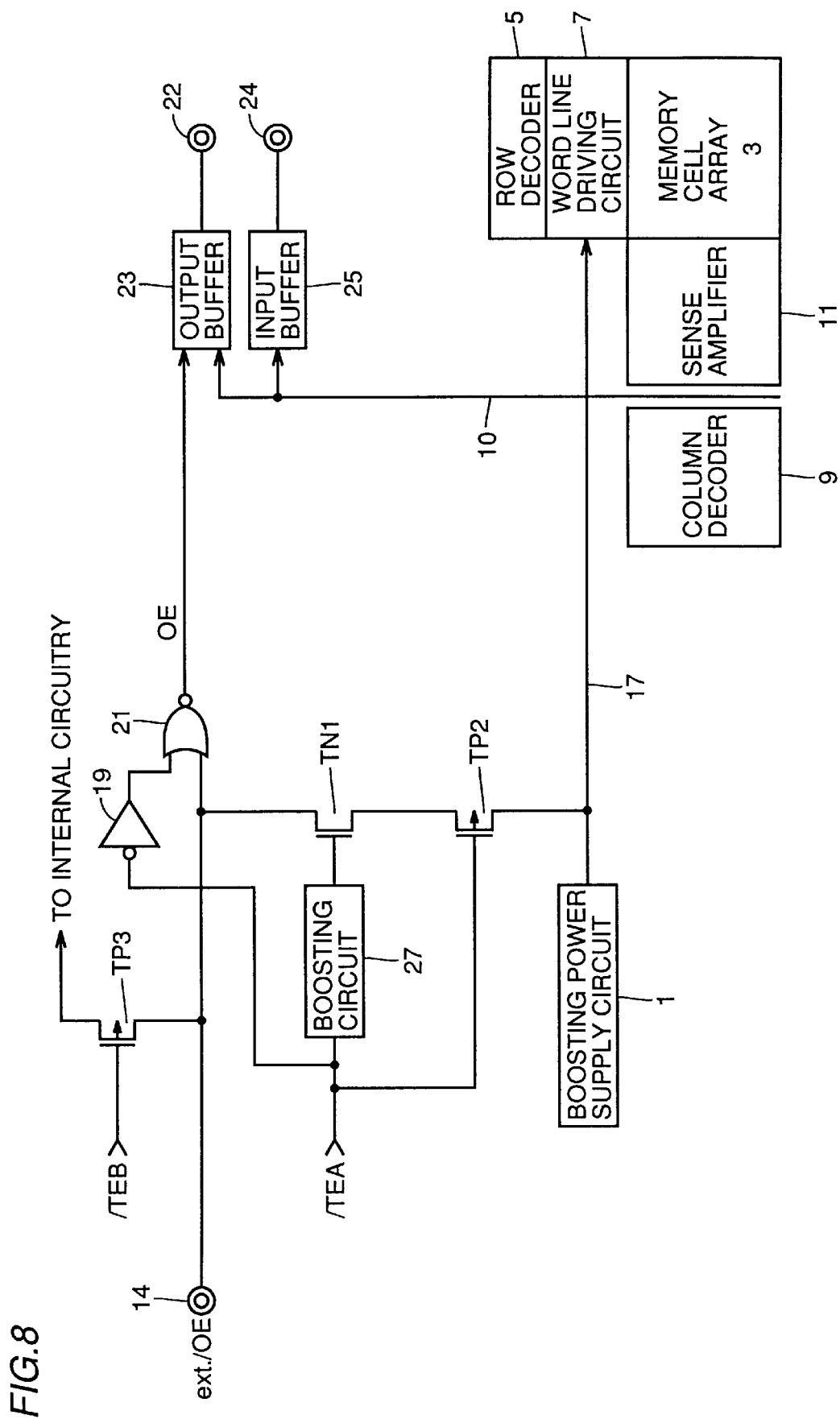
FIGS. 8 and 9 shows an entire structure of a semiconductor memory device according to fourth and fifth embodiments, respectively, of the present invention.

Referring to FIG. 8, a semiconductor memory device according to a fourth embodiment of the present invention includes, in addition to the structure of the third embodiment, a P channel MOS transistor TP3 having its drain connected to output enable terminal 14, and a P channel MOS transistor TP2 having its source connected to the source of N channel MOS transistor TN1 and its drain connected to boosted voltage supply line 17.

The operation of the semiconductor memory device of the fourth embodiment will be described hereinafter. It is assumed that this semiconductor memory device operates in the above-described disturb accelerated test mode (referred to as "test mode A" in the fourth embodiment) as well as in another test mode (referred to as "test mode B" hereinafter).

In test mode B, a test mode enable signal /TEB activated at an L level is applied to the gate of P channel MOS transistor TP3. As a result, P channel MOS transistor TP3 is turned on. In this mode, a negative substrate voltage Vbb, for example, is supplied to output enable terminal 14. As a result, substrate voltage Vbb is applied to internal circuitry via P channel MOS transistor TP3, and a desired test is carried out.

Here, test enable signal /TEA is inactivated, and voltage of 0 V is supplied from boosting circuit 27 to the gate of N channel MOS transistor TN1. If the absolute value of the above-described negative substrate voltage Vbb is greater than threshold voltage Vth of N channel MOS transistor TN1, the potential difference across the gate and source of N channel MOS transistor TN1 becomes greater than threshold voltage Vth, whereby N channel MOS transistor TN1 is turned on. However, if the potential level of inactive test mode enable signal /TEA applied to the gate of P channel MOS transistor TP2 is greater than the difference between boosted voltage Vpp from boosting power supply circuit 1 and threshold voltage Vthp of P channel MOS transistor TP2, the potential difference across the gate and source of P channel MOS transistor TP2 becomes smaller than threshold voltage Vthp, whereby P channel MOS transistor TP2 is continuously turned off. This prevents substrate voltage Vbb from leaking to boosted voltage supply line 17.

In test mode A, test mode enable signal /TEB of inactive H level is supplied to the gate of P channel MOS transistor TP3. As a result, P channel MOS transistor TP3 is turned off. In response to test mode enable signal /TEA being activated to an L level, the semiconductor memory device of the fourth embodiment carries out an operation similar to that of the third embodiment. More specifically, N channel MOS transistor TN1 and P channel MOS transistor TP2 are both turned on, so that the external voltage supplied to output enable terminal 14 is provided to boosted voltage supply line 17 via these transistors.

Fifth Embodiment

Figure 9:
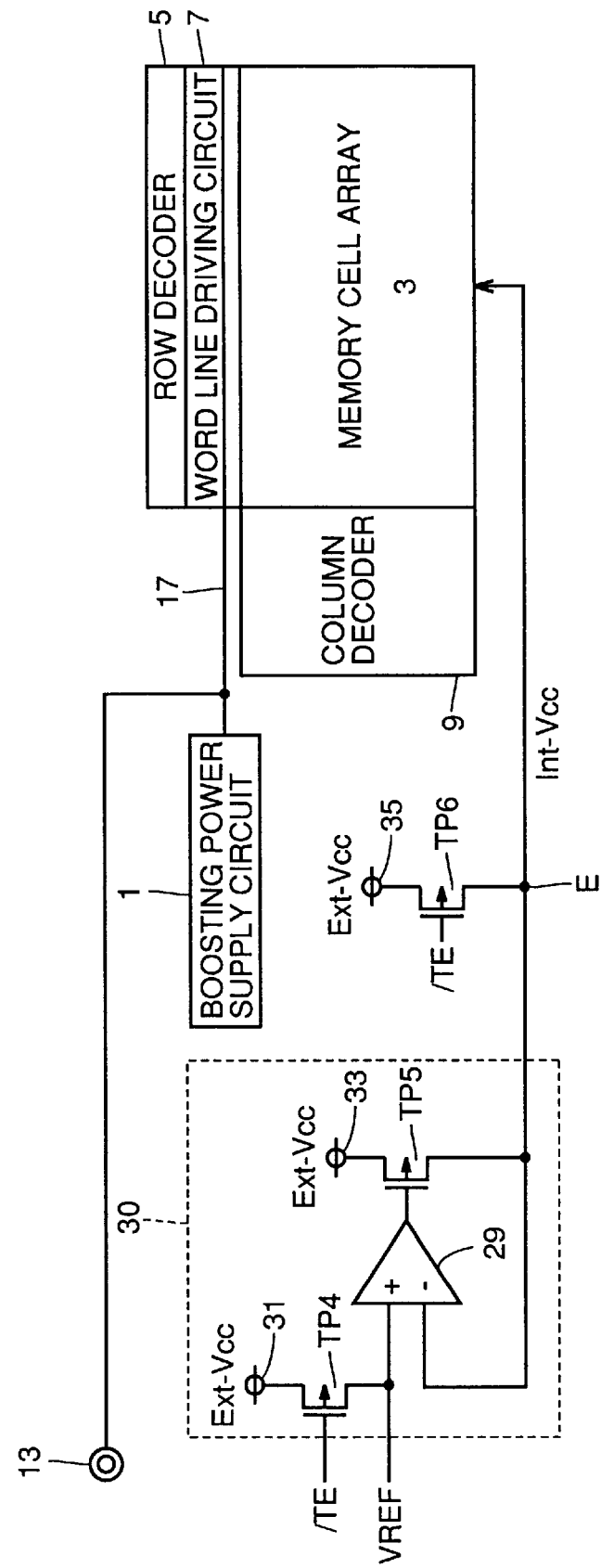

Referring to FIG. 9, a semiconductor memory device according to a fifth embodiment of the present invention includes, in addition to the structure of the first embodiment, a node E connected to memory cell array 3, a voltage-down power supply unit 30 connected to node E, an external power supply node 35, and a P channel MOS transistor TP6 having its source connected to external power supply node 35 and its drain connected to node E.

Voltage-down power supply unit 30 includes external power supply nodes 31 and 33, P channel MOS transistors TP4 and TP5, and a comparator circuit 29.

The operation of the semiconductor memory device of the fifth embodiment will be described hereinafter.

In a normal operation mode, test mode enable signal /TE of an inactive H level is applied to the gates of P channel MOS transistors TP4 and TP6 to turn on these transistors. The potential of internal power supply voltage Int-Vcc is compared with a reference potential VREF by comparator circuit 29. In response to the comparison result, P channel MOS transistor TP5 is turned on. As a result, internal power supply voltage Int-Vcc with the reference potential VREF is supplied from external power supply node 33 to memory cell array 3.

In a disturb accelerated test mode, test mode enable signal /TE of an activated L level is supplied to the gate of P channel MOS transistor TP4. As a result, P channel MOS transistor TP4 is turned on, whereby reference potential VREF is pulled up to the level of external power supply voltage Ext-Vcc. External power supply voltage Ext-Vcc is output from voltage-down power supply unit 30. Also, P channel MOS transistor TP6 is turned on, so that external power supply voltage Ext-Vcc is directly provided from external power supply node 35 to memory cell array 3.

According to the semiconductor memory device of the fifth embodiment, external power supply voltage Ext-Vcc is directly supplied to memory cell array 3 without being down-converted by voltage-down power supply unit 30 that is provided internally in a disturb accelerated test mode. Data leakage of each memory cell in memory cell array 3 can be accelerated to further reduce the time required for read disturb testing.

The present embodiment has been described in which voltage-down power supply unit 30, external power supply node 35 and P channel MOS transistor TP6 are further included in the semiconductor memory device of the first embodiment. Similarly, these components of voltage-down unit 30, external power supply node 35 and P channel MOS transistor TP6 can also be applied to the second to fourth embodiments.

Sixth Embodiment

Figure 10:
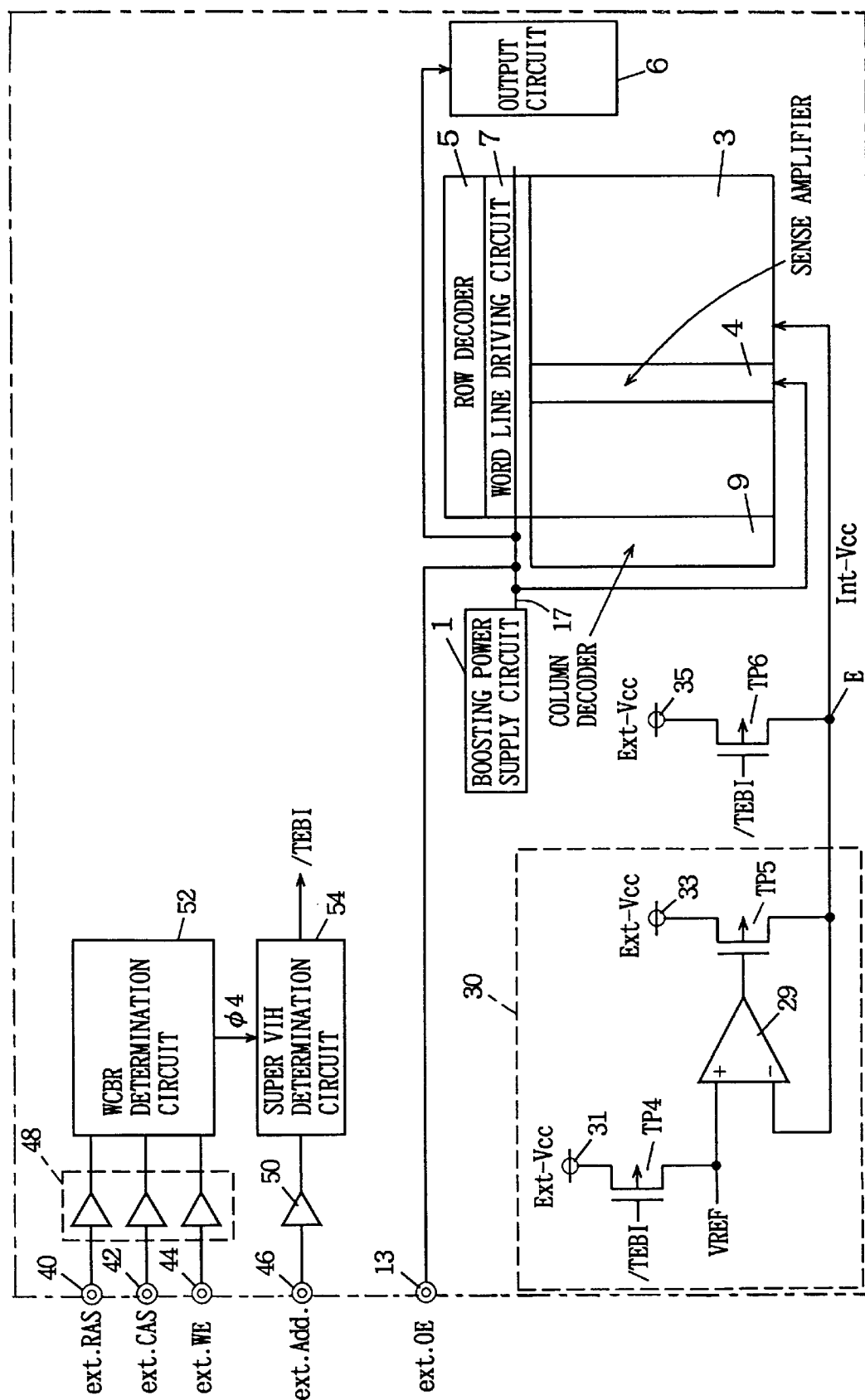
FIG. 10 shows an entire structure of a semiconductor memory device according to a sixth embodiment of the present invention.

FIG. 10 shows an entire structure of a semiconductor memory device according to a sixth embodiment of the present invention.

The semiconductor memory device according to the sixth embodiment of the present invention has a structure similar to that of the semiconductor memory device of the fifth embodiment, provided that a boosted voltage is supplied from boosting power supply circuit 1 to output circuit 6 and word line driving circuit 7, and for selecting a bit line pair to be activated.

The semiconductor memory device of the sixth embodiment includes a row address strobe signal input terminal 40, a column address strobe signal input terminal 42, a write enable signal input terminal 44, a buffer 48 for buffering signals applied to these terminals, a WCBR determination circuit 52 connected to buffer 48, an address signal input terminal 46, a buffer 50 for buffering the signal applied to address signal input terminal 46, and a super VIH determination circuit 54 connected to WCBR determination circuit 52 and buffer 50.

Figure 11:
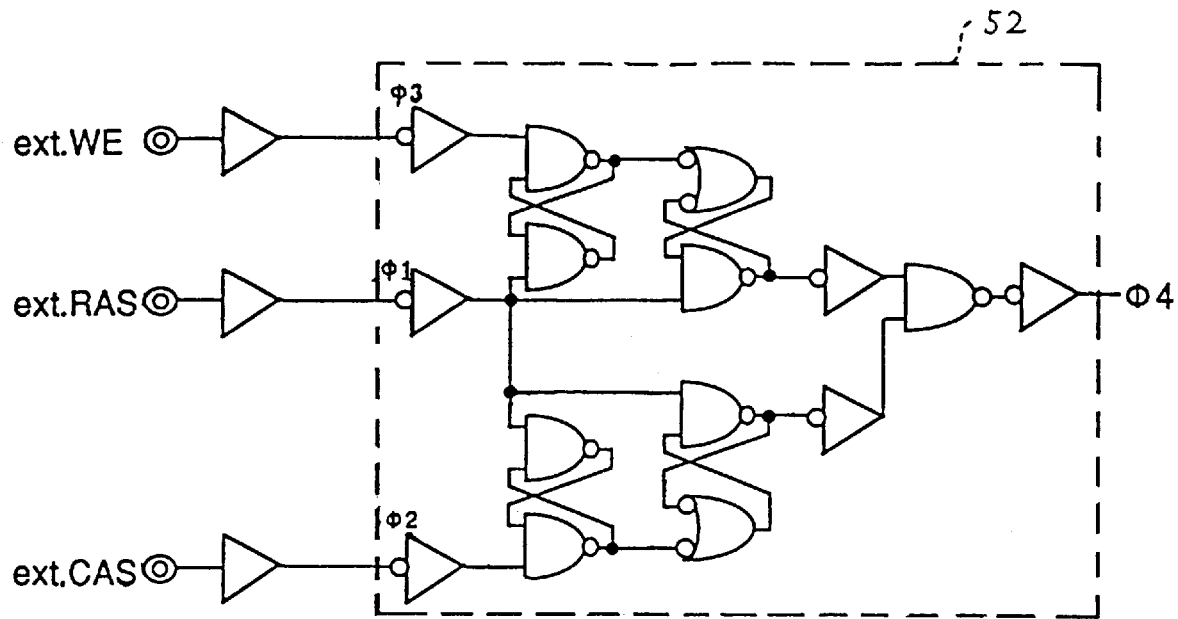
FIG. 11 is a circuit diagram showing a structure of a WCBR determination circuit shown in FIG. 10.
Figure 12:
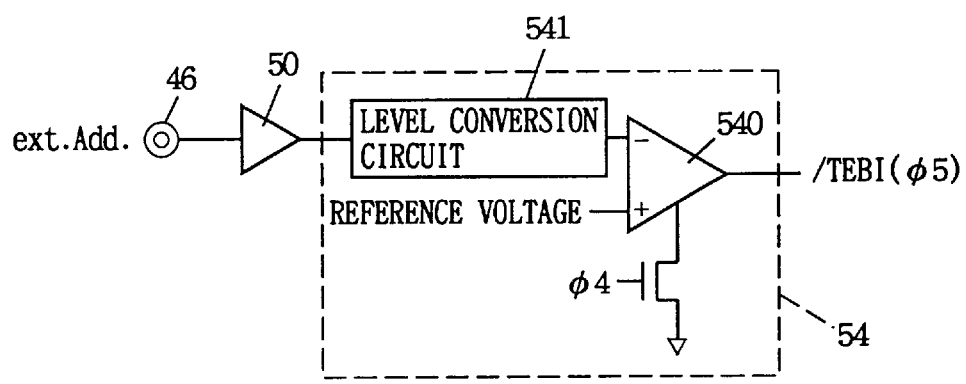
FIG. 12 shows a structure of a super VIH determination circuit shown in FIG. 10.

Examples of a structure of WCBR determination circuit 52 and super VIH determination circuit 54 are shown in FIGS. 11 and 12, respectively.

The operation of the semiconductor memory device according to the sixth embodiment will be described hereinafter.

When the signal to WCBR determination circuit 52 is applied at the timing as shown in FIG. 13, i.e. when signals /CAS and /WE attain an L level at the fall of signal /RAS (referred to as "WCBR timing" hereinafter), signal φ4 of a high level is output from WCBR determination circuit 52.

Signal φ4 is applied to super VIH determination circuit 54, whereby comparator 540 shown in FIG. 12 is enabled. Address signal Add. generated by external address signal ext.Add. applied via address signal input terminal 46 being level-converted is compared with a predetermined reference voltage at comparator 540. When the level of address signal Add. is greater than the level of the external power supply voltage as shown in FIG. 13(d) (an H level of approximately 4.5 V, for example, in a 3.3 V device, referred to as "super VIH level" hereinafter), an activated burn-in test mode signal /TEBI of an L level is provided from comparator 540.

It is not necessary to newly provide a terminal for setting a burn-in test mode since the burn-in test mode can be specified at a particular timing of an externally applied signal.

Burn-in test mode signal /TEBI is applied to the gates of P channel transistors TP4 and TP6, whereby an external power supply voltage is supplied to memory cell array 3 in a burn-in test mode. The operation is similar to the operation of the semiconductor memory device of the above-described fifth embodiment.

Input terminal 13 functions as an output enable signal input terminal in the semiconductor memory device of the present embodiment. An external voltage is externally provided directly to a boosted voltage supply line in a burn-in test mode via this terminal.

An external voltage can be supplied from the outside world as in the above-described second to fourth embodiments in the burn-in test mode.

Thus, according to the semiconductor memory device of the sixth embodiment, burn-in testing can be carried out at a level of a boosted voltage independent of variation in process and temperature.

Seventh Embodiment

Figure 14:
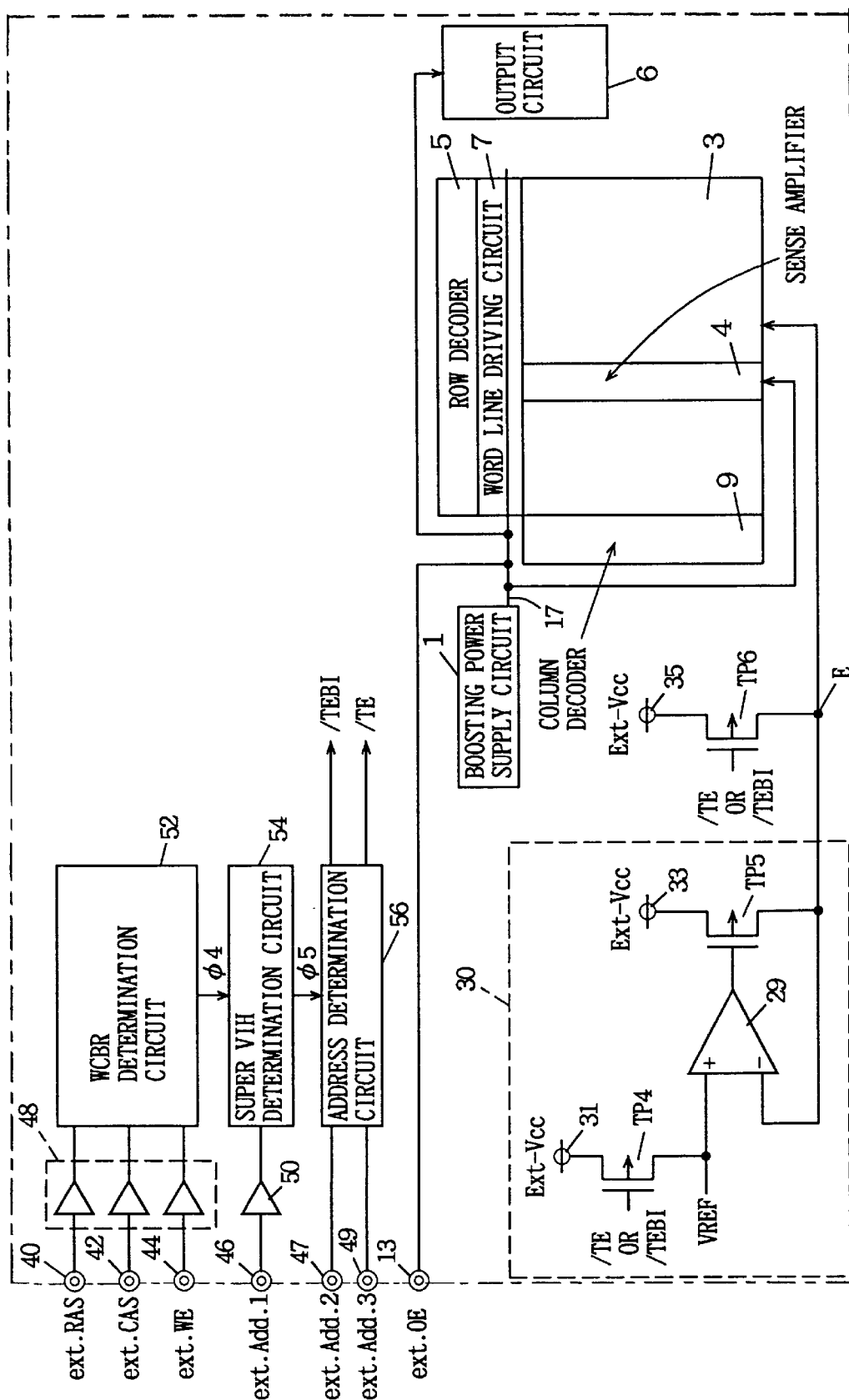
FIG. 14 shows an entire structure of a semiconductor memory device according to a seventh embodiment of the present invention.

FIG. 14 shows an entire structure of a semiconductor memory device according to a seventh embodiment of the present invention.

The semiconductor memory device of the seventh embodiment has a structure similar to that of the semiconductor memory device of the sixth embodiment, provided that address signal input terminals 47 and 49, and an address determination circuit 56 are added.

Figure 15:
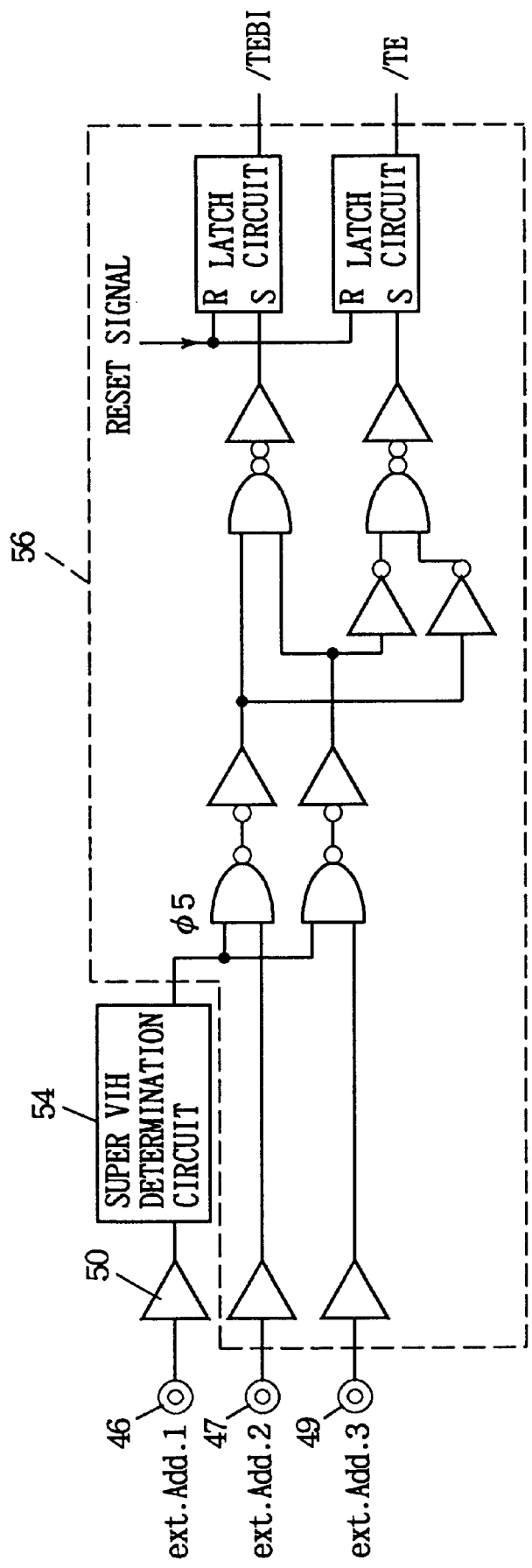
FIG. 15 shows a structure of an address determination circuit of FIG. 14.
Figure 17:
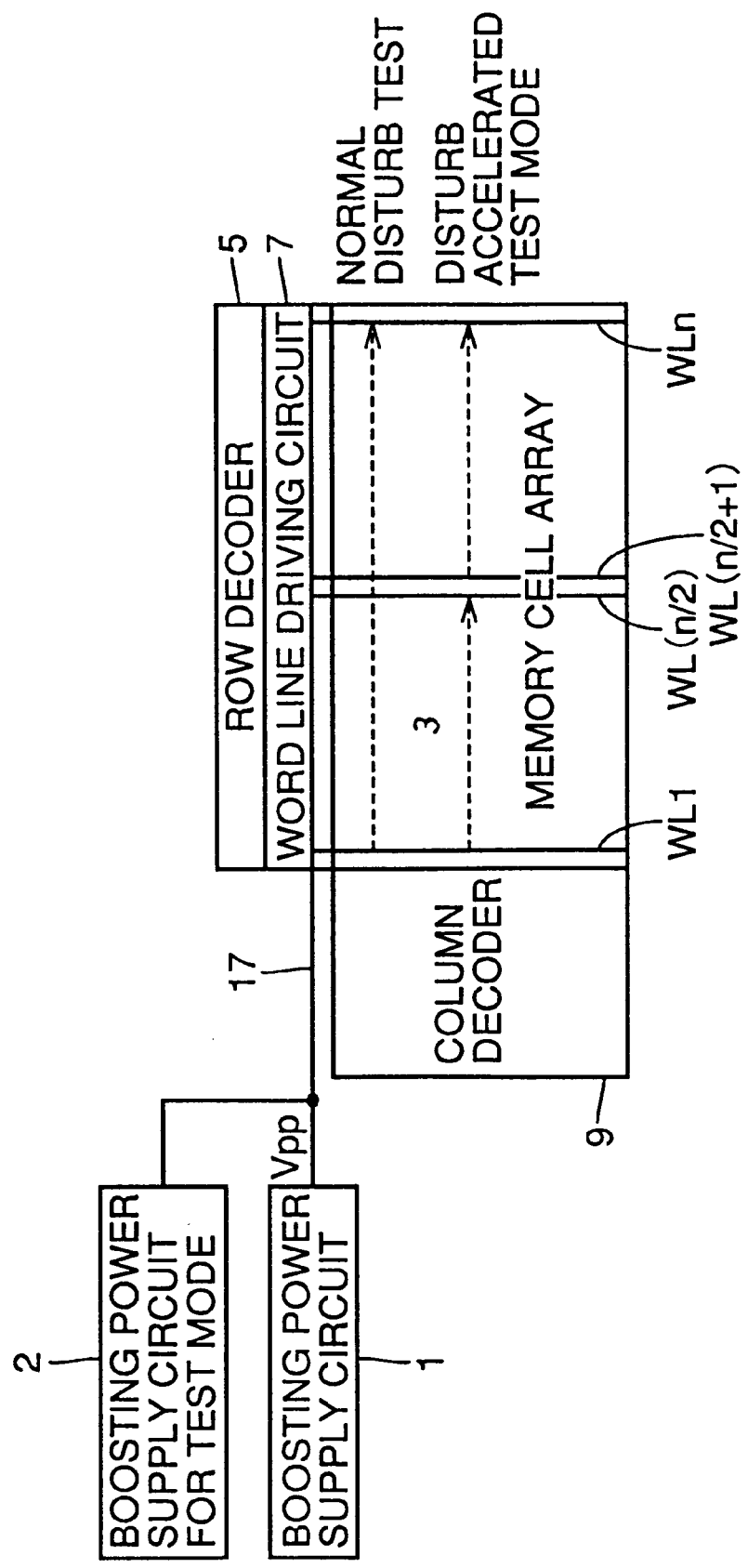
FIG. 17 shows an entire structure of a conventional semiconductor memory device.
Figure 18:
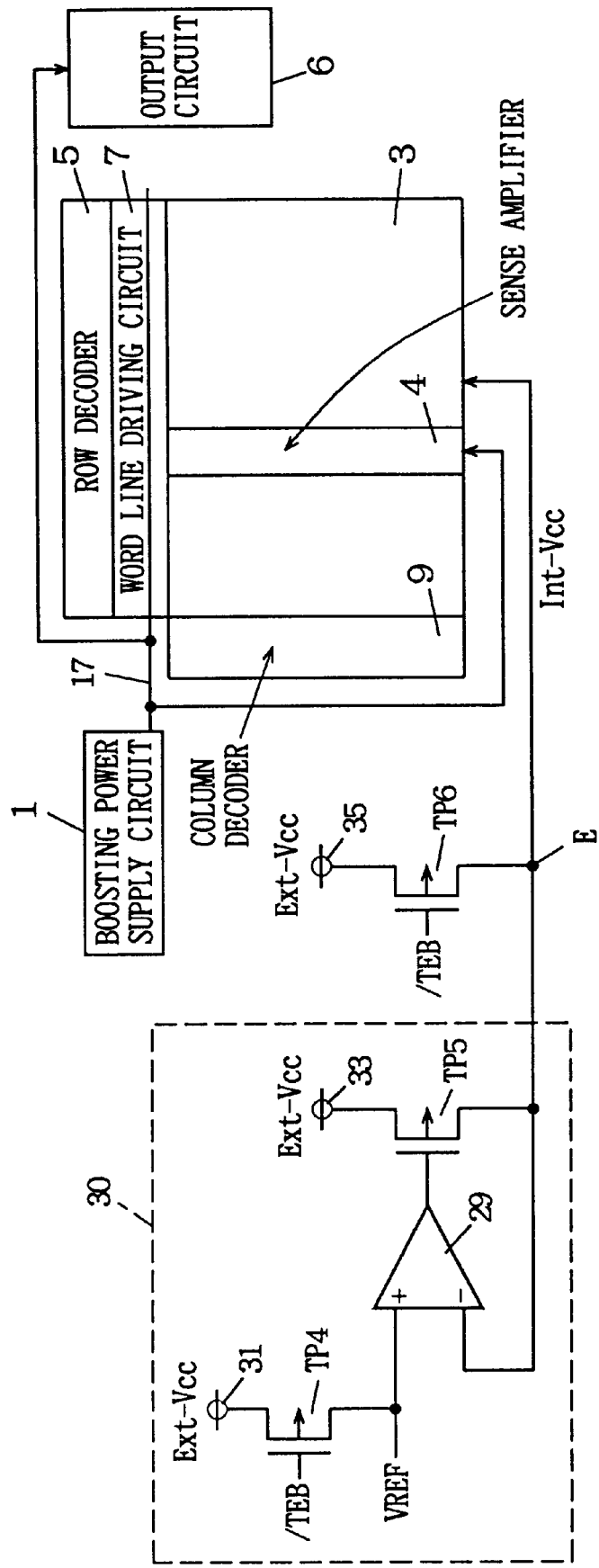
FIG. 18 shows a structure of a conventional semiconductor memory device that can operate in a normal operation mode and a burn-in test mode.

The structure of address determination circuit 56 is shown in FIG. 15.

The semiconductor memory device of the present embodiment operates in a normal operation mode, a burn-in test mode, and a read disturb test mode. The operation thereof will be described hereinafter.

Similar to the operation of the semiconductor memory device of the sixth embodiment, WCBR determination circuit 52 provides signal φ4 of a high level to super VIH determination circuit 54 when determination is made that input signals /RAS, /CAS and /WE are provided at the WCBR timing. Here, super VIH determination circuit 54 provides signal φ5 to address determination circuit 56 when input address signal Add. attains the super VIH level.

Address determination circuit 56 selectively provides burn-in test mode signal /TEBI or read disturb test mode signal /TE to enter a burn-in test mode or a read disturb test mode, respectively, according to the combination of the levels of external address signals ext.Add.2 and ext.Add.3 applied to address signal input terminals 47 and 49.

For example, address determination circuit 56 provides burn-in test mode signal /TEBI when address signal Add.1 attains a super VIH level and address signal Add.2 and Add.3 both attain an H level at a fall of signal /RAS as shown in FIG. 16, and provides read disturb test mode signal /TE when address signal Add.1 attains a super VIH level and address signals Add.2 and Add.3 both attain an L level.

Activated burn-in test mode signal /TEBI of an L level or read disturb test mode signal /TE are supplied to the gates of P channel MOS transistors TP4 and TP6, respectively, whereby external power supply voltage Ext-Vcc is directly applied from external power supply nodes 33 and 35 directly to memory cell array 3 in both test modes.

In a burn-in test mode and a read disturb test mode, respective required voltages are supplied by output enable signal input terminal 13.

According to the semiconductor memory device of the seventh embodiment, two types of test modes can easily be used in a distinguished manner by simple timing setting.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device having a normal operation mode and a read disturb test mode, comprising:
    a plurality of word lines,
    word line driving means responsive to a row address signal for driving one of said word lines in said normal operation mode, and for driving at least two of said word lines simultaneously in said read disturb test mode,
    boosted voltage generation means for generating an internal boosted voltage in said normal operation mode and said read disturb test mode,
    a boosted voltage supply line connected between said boosted voltage generation means and said word line driving means, and
    an input terminal connected to said boosted voltage supply line for receiving an external boosted voltage in said read disturb test mode.

2. The semiconductor memory device according to claim 1, further comprising a function circuit for carrying out a predetermined operation,
    wherein said input terminal supplies a control signal to said function circuit in said normal operation mode.

3. The semiconductor memory device according to claim 2, further comprising switching means connected between said input terminal and said boosted voltage supply line for supplying said external boosted voltage to said boosted voltage supply line from said input terminal in said read disturb test mode.

4. The semiconductor memory device according to claim 3, wherein said switching means includes a P channel MOS transistor.

5. The semiconductor memory device according to claim 3, wherein said switching means comprises
    an N channel MOS transistor having a source connected to said boosted voltage supply line and a drain connected to said input terminal, and
    gate voltage supply means for supplying a boosted gate voltage to a gate of said N channel MOS transistor.

6. The semiconductor memory device according to claim 5, wherein said switching means further comprises a P channel MOS transistor having a source connected to the source of said N channel MOS transistor and a drain connected to said boosted voltage supply line.

7. The semiconductor memory device according to claim 1, further comprising:
    a memory cell array,
    voltage-down means for down-converting an external power supply voltage to generate an internal power supply voltage and supply the internal power supply voltage to said memory cell array in said normal operation mode, and for supplying said external power supply voltage to said memory cell array in said read disturb test mode, and external power supply voltage supply means for supplying said external power supply voltage to said memory cell array only in said read disturb test mode.

8. A semiconductor memory device having a normal operation mode and a burn-in test mode, comprising:

boosted voltage generation means for generating an internal boosted voltage in said normal operation mode and said burn-in test mode, an internal circuit to which said internal boosted voltage is supplied, a boosted voltage supply line connected between said boosted voltage generation means and said internal circuit, an input terminal connected to said boosted voltage supply line for receiving a first external boosted voltage in said burn-in test mode, and voltage-down means for down-converting an external power supply voltage to generate and supply an internal power supply voltage to said internal circuit in said normal operation mode, and for supplying said external power supply voltage to said internal circuit in said burn-in test mode.

9. The semiconductor memory device according to claim 8, further comprising:

a row address strobe signal input terminal for receiving an externally applied row address strobe signal, a column address strobe signal input terminal for receiving an externally applied column address strobe signal, a write enable signal input terminal for receiving an externally applied write enable signal, a first address signal input terminal for receiving an externally applied first address signal, WCBR detection means for detecting generation of WCBR timing that said column address strobe signal and said write enable signal are both activated before said row address strobe signal applied is activated, and super VIH determination means for determining whether said first address signal of a level exceeding the level of said external power supply voltage is applied to said first address signal input terminal, wherein mode is switched from said normal operation mode to said burn-in test mode when generation of said WCBR timing is detected by said WCBR detection means, and when determination is made that said first address signal of the level exceeding the level of said external power supply voltage is applied to said first address signal input terminal by said super VIH determination means.

10. The semiconductor memory device according to claim 9, further having a read disturb test mode, and comprising:

a second address signal input terminal for receiving an externally applied second address signal, a third address signal input terminal for receiving an externally applied third address signal, and mode selection means for selecting said burn-in test mode or said read disturb test mode in response to a combination of levels of said second address signal and said third address signal when generation of said WCBR timing is detected by said WCBR detection means, and when determination is made that said first address signal of the level exceeding the level of said external power supply voltage is applied to said first address signal input terminal by said super VIH determination means, wherein said internal circuit comprises a memory cell array including a plurality of memory cells, a plurality of word lines connected to said memory cells, and word line driving means for driving said word lines in response to a row address signal in said normal operation mode, and for driving simultaneously at least two of said word lines in said read disturb test mode, wherein said input terminal receives a second external boosted voltage in said read disturb test mode, and said memory cell array receives said external power supply voltage from said voltage-down means in said read disturb test mode.

11. A semiconductor memory device having a normal operation mode and a burn-in test mode, comprising:

boosted voltage generation means for generating an internal boosted voltage;

an internal circuit to which said internal boosted voltage is supplied;

a boosted voltage supply line connected between said boosted voltage generation means and said internal circuit;

an input terminal connected to said boosted voltage supply line for receiving a first external boosted voltage in said burn-in test mode;

voltage-down means for down-converting an external power supply voltage to generate and supply an internal power supply voltage to said internal circuit in said normal operation mode, and for supplying said external power supply voltage to said internal circuit in said burn-in test mode;

a row address strobe signal input terminal for receiving an externally applied row address strobe signal;

a column address strobe signal input terminal for receiving an externally applied column address strobe signal;

a write enable signal input terminal for receiving an externally applied write enable signal;

a first address signal input terminal for receiving an externally applied first address signal;

WCBR detection means for detecting generation of WCBR timing that said column address strobe signal and said write enable signal are both activated before said row address strobe signal applied is activated; and super VIH determination means for determining whether said first address signal of a level exceeding the level of said external power supply voltage is applied to said first address signal input terminal, wherein mode is switched from said normal operation mode to said burn-in test mode when generation of said WCBR timing is detected by said WCBR detection means, and when determination is made that said first address signal of the level exceeding the level of said external power supply voltage is applied to said first address signal input terminal by said super VIH determination means.

12. The semiconductor memory device according to claim 11, further having a read disturb test mode, comprising:

a second address signal input terminal for receiving an externally applied second address signal;

a third address signal input terminal for receiving an externally applied third address signal; and mode selection means for selecting said burn-in test mode or said read disturb test mode in response to a combination of levels of said second address signal and said third address signal when generation of said WCBR timing is detected by said WCBR detection means, and when determination is made that said first address signal of the level exceeding the level of said external power supply voltage is applied to said first address signal input terminal by said super VIH determination means, wherein said internal circuit comprises a memory cell array including a plurality of memory cells, a plurality of word lines connected to said memory cells, and word line driving means for driving said word lines in response to a row address signal in said normal operation mode, and for driving simultaneously at least two of said word lines in said read disturb test mode, wherein said input terminal receives a second external voltage in said read disturb test mode, and said memory cell array receives said external power supply voltage from said voltage-down means in said read disturb test mode.

13. The semiconductor memory device according to claim 12, wherein said mode selection means includes a latch circuit to latch a mode selection signal for selecting said burn-in test mode or said read disturb test mode and to be reset by accepting a reset signal.

14. The semiconductor memory device according to claim 11, wherein said input terminal receives an external signal in said normal operation mode.

15. The semiconductor memory device according to claim 14, wherein said external signal is output enable signal.

16. The semiconductor memory device according to claim 1, wherein said input terminal receives an external signal in said normal operation mode.

17. The semiconductor memory device according to claim 16, wherein said external signal is output enable signal.

\* \* \* \* \*